US008669182B2

(12) United States Patent
Yang et al.

(10) Patent No.: US 8,669,182 B2
(45) Date of Patent: Mar. 11, 2014

(54) METAL CAP WITH ULTRA-LOW κ DIELECTRIC MATERIAL FOR CIRCUIT INTERCONNECT APPLICATIONS

(75) Inventors: Chih-Chao Yang, Glenmont, NY (US); Daniel C. Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 13/398,070

(22) Filed: Feb. 16, 2012

(65) Prior Publication Data

US 2012/0149191 A1     Jun. 14, 2012

Related U.S. Application Data

(62) Division of application No. 11/766,261, filed on Jun. 21, 2007, now Pat. No. 8,138,604.

(51) Int. Cl.
*H01L 23/52*     (2006.01)
*H01L 21/44*     (2006.01)

(52) U.S. Cl.
USPC ........... 438/687; 438/628; 438/644; 438/654; 438/680; 257/752; 257/762; 257/767; 257/E23.145; 257/E23.161

(58) Field of Classification Search
USPC .......... 257/750–752, 758, 762, 767, E23.019, 257/E23.142, E23.145, E23.161, E23.162; 438/627, 628, 643, 644, 653, 654, 680, 438/687
See application file for complete search history.

(56) References Cited

U.S. PATENT DOCUMENTS

| 5,585,673 | A | 12/1996 | Joshi et al. |
| 5,695,810 | A | 12/1997 | Dubin et al. |
| 6,323,554 | B1 | 11/2001 | Joshi et al. |
| 6,342,733 | B1 | 1/2002 | Hu et al. |
| 6,706,625 | B1 | 3/2004 | Sudijono et al. |
| 7,026,714 | B2 | 4/2006 | Cunningham |
| 7,438,949 | B2 * | 10/2008 | Weidman ...................... 427/250 |
| 2004/0113279 | A1 | 6/2004 | Chen et al. |
| 2006/0113675 | A1 | 6/2006 | Chang et al. |
| 2008/0073748 | A1 * | 3/2008 | Bielefeld et al. .............. 257/522 |
| 2008/0120580 | A1 | 5/2008 | Hsu et al. |
| 2008/0197500 | A1 | 8/2008 | Yang et al. |

\* cited by examiner

*Primary Examiner* — Matthew E Warren
(74) *Attorney, Agent, or Firm* — Scully, Scott, Murphy & Presser, P.C.; H. Daniel Schnurmann (57) ABSTRACT

An interconnect structure is provided that has enhanced electromigration reliability without degrading circuit short yield, and improved technology extendibility. The inventive interconnect structure includes a dielectric material having a dielectric constant of about 3.0 or less. The dielectric material has at least one conductive material embedded therein. A noble metal cap is located directly on an upper surface of the at least one conductive region. The noble metal cap does not substantially extend onto an upper surface of the dielectric material that is adjacent to the at least one conductive region, and the noble cap material does not be deposited on the dielectric surface. A method fabricating such an interconnect structure utilizing a low temperature (about 300° C. or less) chemical deposition process is also provided.

17 Claims, 5 Drawing Sheets

METAL CAP WITH ULTRA-LOW κ DIELECTRIC MATERIAL FOR CIRCUIT INTERCONNECT APPLICATIONS

CROSS REFERENCE TO RELATED APPLICATION

This application is a divisional of U.S. patent application Ser. No. 11/766,261, filed Jun. 21, 2007 the entire content and disclosure of which is incorporated herein by reference.

FIELD OF THE INVENTION

The present invention relates to a semiconductor interconnect structure, and a method of fabricating the same. More particularly, the present invention relates to a semiconductor interconnect structure having enhanced electromigration (EM) reliability in which a noble metal cap is located directly on a surface of a conductive material that is embedded within a low dielectric constant k dielectric material.

BACKGROUND OF THE INVENTION

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. EM is one of the worst reliability concerns for very large scale integrated (VLSI) circuits and manufacturing since the 1960's. The problem not only needs to be overcome during the process development period in order to qualify the process, but it also persists through the lifetime of the chip. Voids are created inside the metal conductors of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction of the bottom of the interconnect, which eventually results in a circuit dead opening.

Figure 1A:
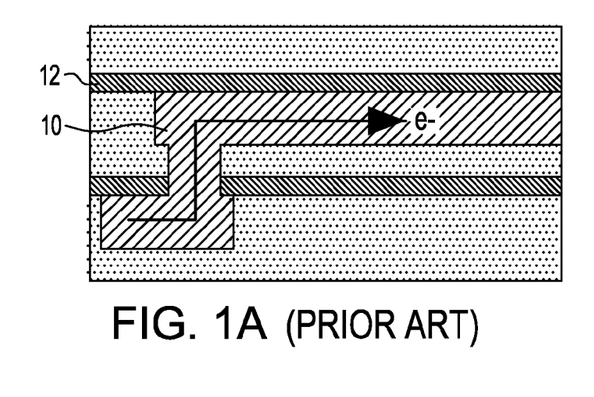
FIGS. 1A-1D are pictorial representations (through cross sectional views) illustrating the formation of a circuit dead opening in a prior art interconnect structure which is caused by EM failure.
Figure 1B:
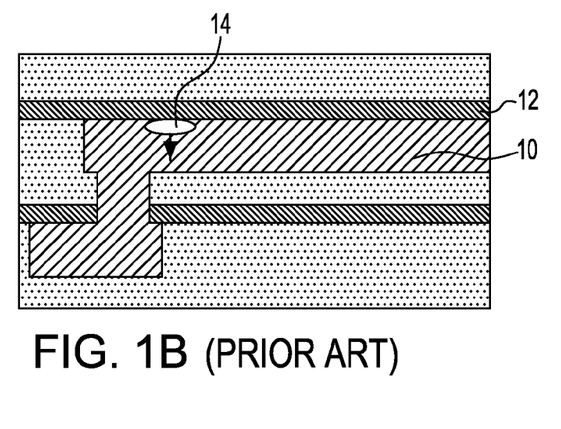
Figure 1C:
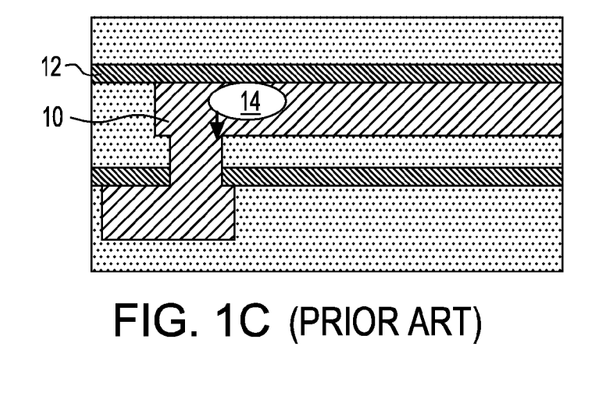
Figure 1D:
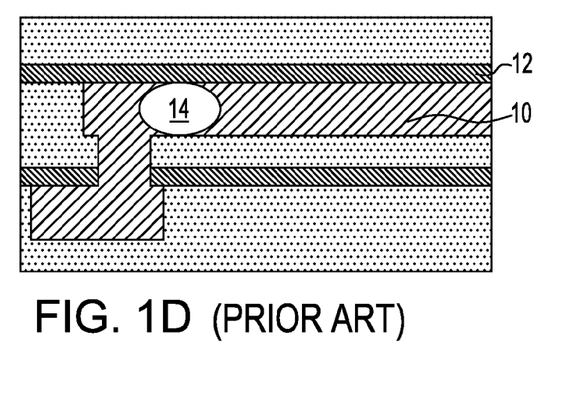

FIGS. 1A-1D are pictorial representations of a prior art interconnect structure at various stages of an EM failure. In these drawings, reference numeral 12 denotes the dielectric cap, and reference numeral 10 denotes the metal interconnect feature; all other components of the prior art interconnect structure are not labeled to avoid obscuring the EM problem. FIG. 1A is at an initial stress stage. FIG. 1B is at a time when void 14 nucleation initiates at the metal interconnect feature 10/dielectric cap 12 interface. FIG. 1C is at a time when the void 14 grows toward the bottom of the conductive feature 10, and FIG. 1D is at a time in which the void 14 growth crosses the metal interconnect feature 10 causing a circuit dead opening.

Figure 2:
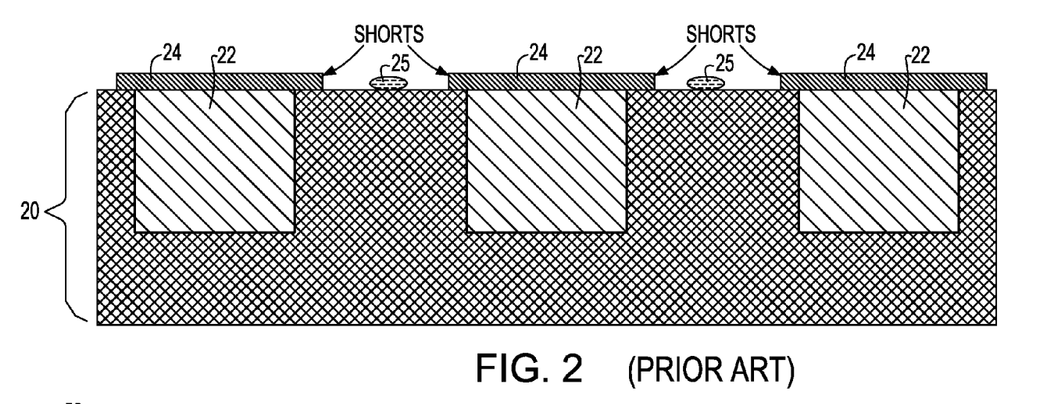
FIG. 2 is a prior art interconnect structure including a Co-containing alloy metal cap located atop a conductive material that is embedded with a dielectric material, and metal residues from the Co-containing alloy cap process are present on the dielectric surface.

It has been demonstrated that by replacing the Cu/dielectric interface with a Cu/metal interface can enhance electromigration resistance by greater than 100×. Prior art metal caps are typically comprised of a Co-containing alloy such as, for example, CoWP, which is selectively deposited atop of the Cu conductor region of the interconnect structure. One problem with utilizing such selective deposited metal caps is that some of the metal cap extends onto the adjoining surface of the interconnect dielectric material and, as such, electrical shorts between adjacent interconnects may arise. This is seen, for example, in FIG. 2 wherein reference numeral 20 denotes a dielectric material, reference numeral 22 denotes a conductive material embedded with the dielectric material 20, reference numeral 24 denotes a Co-containing alloy metal cap, and reference numeral 25 denotes a metal residues from the Co-containing alloy cap process.

In view of the above, there is a need for providing an interconnect structure which avoids a circuit dead opening caused by EM failure as well as electrical shorts between adjacent interconnect structures which are typically exhibited when prior art selectively deposited Co-containing metal caps are employed.

SUMMARY OF THE INVENTION

The present invention provides a circuit interconnect structure that has improved EM reliability. The present invention also provides an interconnect structure in which electrical shorts between adjacent interconnect structures is avoided. The present invention also provides an interconnect structure that has better reliability and technology extendibility for the semiconductor industry.

In particular, the present invention provides an interconnect structure in which a noble metal-containing cap layer is present substantially atop a conductive material which is embedded within a low k dielectric material. The term "low k" is used throughout this application to denote an interconnect dielectric material having a dielectric constant of about 3.0 or less. Applicants have determined that the presence of the low k dielectric material laterally adjacent to the conductive material gives a better selectivity for forming a noble metal directly atop the embedded conductive material. As such, little or none of the noble metal cap extends onto the surface of the laterally adjacent low k dielectric material.

In general terms, the interconnect structure of the present invention comprises:

a dielectric material having a dielectric constant of about 3.0 or less, said dielectric material having at least one conductive material having an upper surface embedded within said dielectric material; and a noble metal cap located directly on said upper surface of said at least one conductive material, said noble metal cap does not substantially extend onto an upper surface of said dielectric material that is adjacent to said at least one conductive material and no noble metal residues are present on the upper surface of said dielectric material.

The phrase "does not substantially extend" is used in the present invention to denote that no or minimal net noble metal is deposited on the low k dielectric material. The minimal extension of the noble metal cap onto the dielectric surface is less than 5 Å. Also, there is no "residues" from the noble metal cap deposition on the dielectric surface. By "residues" it is meant that no fragments of noble metal material form on the dielectric material surface.

The dielectric material which is present in the inventive interconnect structure may be any interconnect dielectric material having a dielectric constant of about 3.0 or less. Illustratively, the dielectric material employed in the present invention comprises a silsesquioxane, a C doped oxide (i.e., an organosilicate) that includes at least atoms of Si, C, O and H, a thermosetting polyarylene ether, or multilayers thereof. The dielectric material may be porous, non-porous or contain regions and/or surfaces that are porous and other regions and/or surfaces that are non-porous.

The conductive material which forms an embedded conductive region within the interconnect structure includes any material that has the ability to transfer electricity. Examples of conductive material that can be present in the conductive region include, for example, polySi, a conductive metal, a conductive metal alloy, a conductive metal silicide or combinations and multilayers thereof. In one embodiment of the present invention, the conductive material includes a conductive metal such as, for example, Cu, W, and/or Al. In a highly preferred embodiment of the present invention, the conductive material includes a Cu-containing conductive material such as, for example, Cu, or a Cu alloy (such as ALCu).

The conductive material is typically separated from the dielectric material by a diffusion barrier. The diffusion barrier prevents diffusion of the conductive material into the dielectric material. Examples of diffusion barriers that can be present within the conductive region include, for example, Ta, TaN, Ti, TiN, Ru, RuN, RuTa, RuTaN, IrTa, IrTaN, W, WN or combinations and multilayers thereof.

The conductive material may be present within a via opening, a line opening, a combined via and line opening or any combination thereof.

The term "noble metal" when referring to the cap located atop the at least one conductive material includes any metal that is resistant to corrosion or oxidation. The preferred noble metals that can be used in the present invention are selected from the group consisting of Ru, Ir, Rh, Pt and alloys thereof. More preferably, the noble metal employed as the noble metal cap comprises Ru or a Ru alloy.

In one embodiment of the present invention, the upper surface of the at least one conductive material is substantially coplanar with the upper surface of the dielectric material. In another embodiment of the present invention, the upper surface of the at least one conductive material is raised with respect to the upper surface of the interconnect dielectric material. Stated in other terms, the present invention contemplates an embodiment in which the upper surface of the dielectric material is recessed relative to the upper surface of the at least one conductive material.

In addition to the interconnect structure mentioned above, the present invention also provides a method of fabricating the same. With respect to the inventive method, not only did the applicants determine that the presence of the low k dielectric material laterally adjacent to the conductive material gives a better selectivity for forming a noble metal directly atop the conductive material, but the applicants have also determined that this selectively is enhanced when a chemical deposition process is used in which the deposition temperature is about 300° C. or less, with a deposition temperature of less than 200° C. being even more preferred.

In general terms, the inventive method includes:

providing a dielectric material having a dielectric constant of about 3.0 or less, said dielectric material having at least one conductive material having an upper surface embedded within said dielectric material; and forming a noble metal cap directly on said upper surface of said at least one conductive material, said noble metal cap does not substantially extend onto an upper surface of said dielectric material that is adjacent to said at least one conductive material, said noble metal cap forming does not result in noble metal residues on the upper surface of said dielectric material, and said forming includes a chemical deposition process that is performed at a temperature of about 300° C. or less.

In some embodiments of the present invention, the upper surface of the dielectric material is recessed to a level that is below the upper surface of the conductive material. When such an embodiment is employed, recessing is performed after noble metal cap formation utilizing a chemical etching process that selectively removes dielectric material as compared with a noble metal and a diffusion barrier.

DETAILED DESCRIPTION OF THE INVENTION

The present invention, which provides an interconnect structure having enhanced electromigration (EM) reliability without degrading circuit short yield and a method of forming the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides an interconnect structure that includes a dielectric material having a dielectric constant of about 3.0 or less. This low k dielectric material has at least one conductive material having an upper surface embedded therein. A noble metal cap is located directly on the upper surface of the at least one conductive material. Because of the presence of the low k dielectric material and the low temperature deposition employed in forming the noble metal cap, the noble metal cap does not substantially extend onto an upper surface of the dielectric material that is adjacent to the at least one conductive material and no metal residues from the noble metal cap deposition form on the dielectric material surface.

The present also provides a method of fabricating such an interconnect structure in which a low temperature chemical deposition process (temperature of about 300° C. or less) is used together with the low k dielectric material to selectively form a noble metal cap substantially atop the at least one conductive material (i.e., a conductive feature) of an interconnect structure.

Figure 3A:
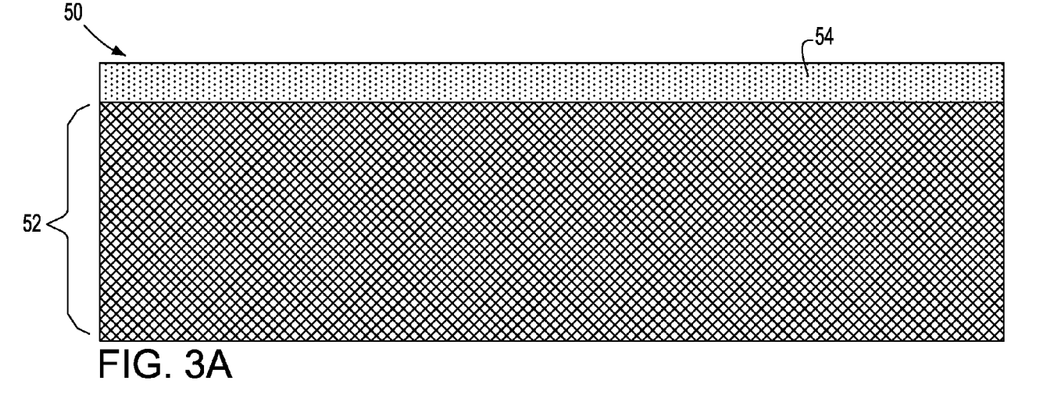
FIGS. 3A-3E illustrate an interconnect structure through various processing steps of the present invention.

Reference is first made to FIGS. 3A-3E which are pictorial representations (through cross sectional views) illustrating one exemplary interconnect structure of the present invention through various processing steps. Specifically, FIG. 3A illustrates an initial structure 50 that can be employed in the present invention in fabricating the inventive interconnect structure. The initial structure 50 includes a dielectric material 52 having a pad stack 54 located on an upper surface thereof.

It is noted that the initial structure 50 is typically located upon a substrate (not shown in the drawings of the present application). The substrate may comprise a semiconducting material, an insulating material, a conductive material or any combination including multilayers thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

When the substrate comprises a combination of an insulating material and a conductive material, the substrate may represent a first interconnect level of a multilayered interconnect structure.

The dielectric material 52 of the initial structure 50 comprises any interlevel or intralevel dielectric including inorganic dielectrics or organic dielectrics. The dielectric material 52 may be porous, non-porous or contain regions and/or surfaces that are porous and other regions and/or surfaces that may be non-porous. Some examples of suitable dielectrics that can be used as the dielectric material 52 include, but are not limited to: silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 52 typically has a dielectric constant that is about 3.0 or less, with a dielectric constant of about 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0. The thickness of the dielectric material 52 may vary depending upon the dielectric material used as well as the exact number of dielectric layers within the dielectric material 52. Typically, and for normal interconnect structures, the dielectric material 52 has a thickness from about 50 to about 1000 nm.

The dielectric material 52 is formed utilizing any conventional deposition process including, but not limited to: chemical vapor deposition (CVD), plasma enhanced chemical vapor deposition (PECVD), evaporation, chemical solution deposition and spin-on coating.

After forming the dielectric material 52, pad stack 54 is formed on an exposed upper surface of dielectric material 52. The pad stack 54 comprises an oxide, nitride, oxynitride or multilayers thereof (e.g., a pad stack comprising a pad oxide and a pad nitride). The pad stack 54 typically comprises a semiconductor oxide, semiconductor nitride and/or a semiconductor oxynitride. Preferably, the pad stack 54 comprises an oxide of silicon and/or a nitride of silicon.

In some embodiments, the pad stack 54 may be formed utilizing any conventional deposition process including, for example, CVD, PECVD, evaporation, chemical solution deposition, physical vapor deposition (PVD) and atomic layer deposition. In other embodiments, the pad stack 54 is formed by a thermal process such as, for example, a thermal oxidation, a thermal nitridation and/or a thermal oxynitridation process. In yet other embodiments, the pad stack 54 is formed utilizing a combination of deposition and thermal processes.

The thickness of the pad stack 54 may vary depending on the number of materials within the pad stack itself as well as the technique that was used in forming the same. Typically, the pad stack 54 has a thickness from about 10 to about 80 nm.

After forming the initial structure 50 shown in FIG. 3A, at least one opening 56 is formed into the dielectric material 52 utilizing the pad stack 54 as a pattern mask. The resultant structure including the at least one opening 56 is shown, for example, in FIG. 3B. The at least one opening 56 may include a via opening, a line opening, a combined via and line opening, or any combinations thereof. In the drawings, three via openings are shown by way of a non-limiting example.

Figure 3B:
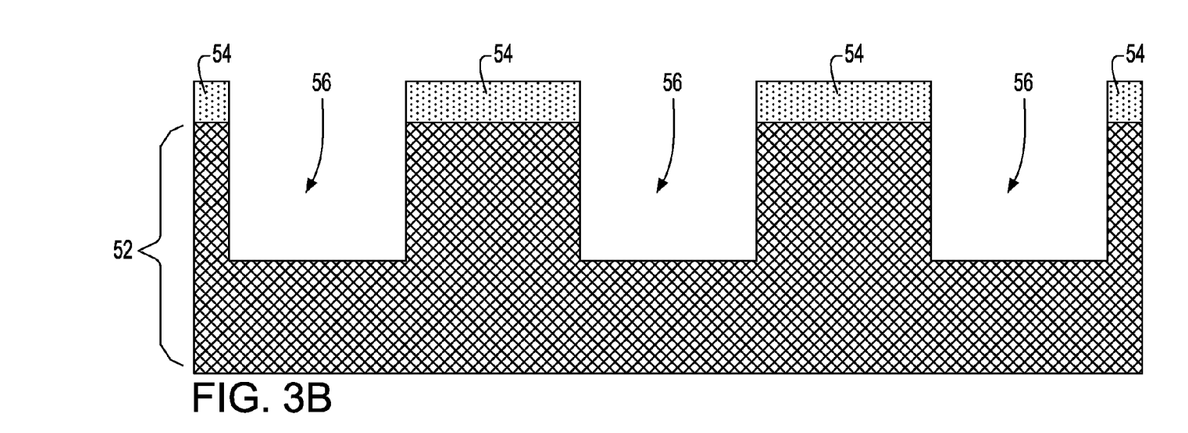

The at least one opening 56 is formed utilizing conventional lithography and etching. The lithographic step includes forming a photoresist (organic, inorganic or hybrid) atop the pad stack 54 utilizing a conventional deposition process such as, for example, CVD, PECVD and spin-on coating. Following formation of the photoresist, the photoresist is exposed to a desired pattern of radiation. Next, the exposed photoresist is developed utilizing a conventional resist development process.

After the development step, an etching step is performed to transfer the pattern from the patterned photoresist into first the pad stack 54 and then the dielectric material 52. The patterned photoresist is typically removed from the surface of the structure after transferring the pattern into the pad stack 54 utilizing a conventional resist stripping process such as, for example, ashing. The etching step used in forming the at least one opening 56 comprises a dry etching process (including reactive ion etching, ion beam etching, plasma etching or laser ablation), a wet chemical etching process or any combination thereof. Typically, reactive ion etching is used to form the at least one opening 56.

Figure 3C:
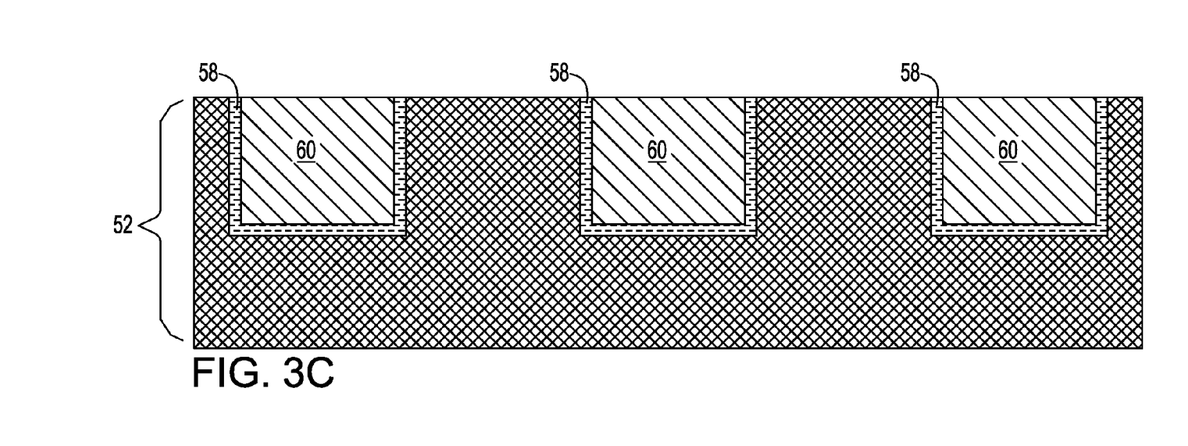

Next, and as shown in FIG. 3C, a diffusion barrier 58 and a conductive material 60 are formed into each of the at least one openings 56. The diffusion barrier 58 comprises Ta, TaN, Ti, TiN, Ru, RuN, RuTa, RuTaN, IrTa, IrTaN, W, WN or any other material that can serve as a barrier to prevent conductive material from diffusing there through. The thickness of the diffusion barrier 58 may vary depending on the deposition process used as well as the material employed. Typically, the diffusion barrier 58 has a thickness from about 4 to about 40 nm, with a thickness from about 7 to about 20 nm being more typical.

The diffusion barrier 58, which is located between the conductive material 60 and the dielectric material 52 is formed by any conventional deposition process including, for example, CVD, PECVD, PVD, sputtering and plating.

The conductive material 60 used in forming the conductive region of the interconnect structure includes, for example, polySi, a conductive metal, an alloy comprising at least one conductive metal, a conductive metal silicide or combinations thereof. Preferably, the conductive material 60 that is used in forming the conductive region is a conductive metal such as Cu, W or Al, with Cu or a Cu alloy (such as AlCu) being highly preferred in the present invention.

The conductive material 60 is formed into each of the openings 56 that are lined with the diffusion barrier 58 utilizing any conventional deposition process including, for example, CVD, PECVD, PVD, sputtering, plating, chemical solution deposition and electroless plating. After deposition of the conductive material 60, the structure is subjected to a planarization process such as, for example, chemical mechanical polishing (CMP) and/or grinding. The planarization process provides a planar structure such as is shown in FIG. 3C in which the upper surfaces of the dielectric material 52, the diffusion barrier 58 and the conductive material 60 are substantially coplanar with each other. It is noted that during the planarization process, the remaining pad stack 54 is removed from the structure.

Figure 3D:
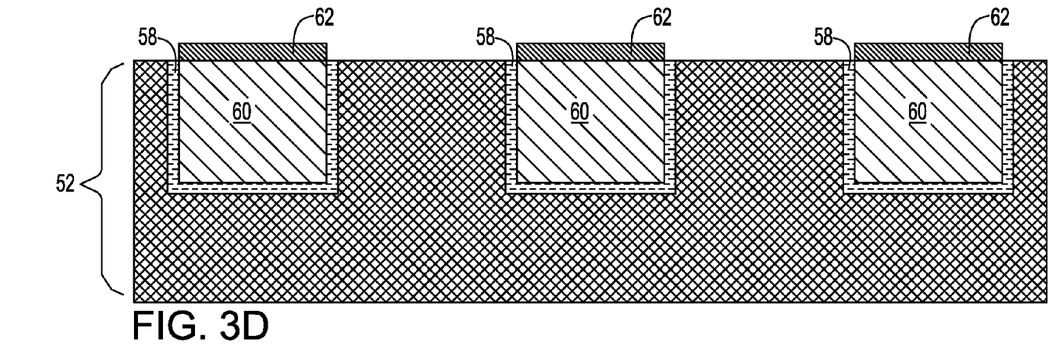

Next, and as is shown in FIG. 3D, a noble metal cap 62 is selectively formed atop the conductive material 60; some of the noble metal cap 62 may extend onto the surface of the diffusion barrier 58, but little or none of the noble metal cap 62 extends onto the surface of the dielectric material 52 that is laterally adjacent to said conductive material 60. None of the noble metal cap 62 (or residues thereof) are deposited (or form) on the dielectric material 52 surface.

The term "noble metal" when referring to the cap 62 located atop the at least one conductive region (i.e., conductive material 60) includes any metal that is resistant to corrosion or oxidation. The preferred noble metals that can be used in the present invention are selected from the group consisting of Ru, Ir, Rh, Pt and alloys thereof. More preferably, the noble metal employed as the noble metal cap comprises Ru or a Ru alloy. In some embodiments, the noble metal cap 62 is comprised of a multilayered noble metal or noble metal alloy stack.

The thickness of the noble metal cap 62 may vary depending on the type of noble metal present in the cap, the deposition technique and conditions used as well as the number of noble metals within the cap. Typically, the noble metal cap 62 has a thickness from about 1 to about 100 Å, with a thickness from about 5 to about 50 Å being more highly preferred.

The noble metal cap 62 is formed utilizing a low temperature deposition process including, for example, CVD, PECVD, low pressure CVD and ALD. By "low temperature", it is meant a deposition temperature of about 300° C. or less, with a deposition temperature of less than about 200° C. being even more preferred. The deposition conditions are selected to provide a deposition rate of the noble metal cap 62 onto the conductive material 60 that is from about 0.2 to about 0.8 Å/sec.

It is again emphasized that the applicants have determined that the selective deposition of the noble metal cap only to the conductive material 60 is enhanced by utilizing a low k dielectric material 52, with k about 3.0 or less, as well as a low temperature chemical deposition process. These two factors are critical in the present invention to avoid forming the noble metal cap onto the dielectric material.

After selectively forming the noble metal cap 62 onto conductive material 60, a dielectric capping layer 64 is formed across the entire structure providing the structure shown in FIG. 3D. The resultant structure including the dielectric capping layer 64 is shown, for example, in FIG. 3E. The dielectric capping layer 64 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof.

Figure 3E:
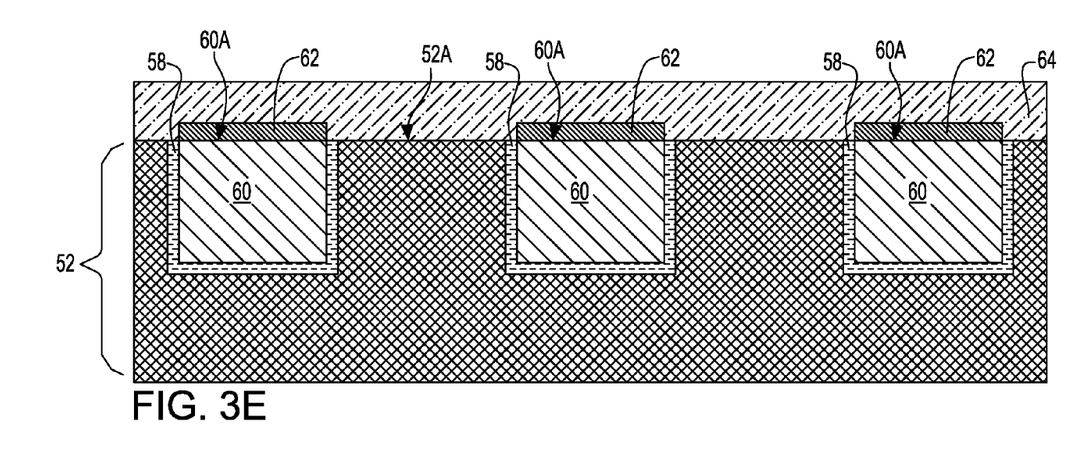

The thickness of the dielectric capping layer 64 may vary depending on the technique used to form the same as well as the material make-up of the layer. Typically, the dielectric capping layer 64 has a thickness from about 15 to about 100 nm, with a thickness from about 25 to about 45 nm being more typical.

The dielectric capping layer 64 is formed utilizing any conventional deposition process including, for example, CVD, PECVD, evaporation, spin-on coating, chemical solution deposition and PVD.

FIG. 3E illustrates an interconnect structure in accordance with an embodiment of the present invention. Specifically, the inventive interconnect structure includes a dielectric material 52 having a dielectric constant of about 3.0 or less. The dielectric material 52 has at least one conductive region (represented by conductive material 60) embedded within the dielectric material 52, said at least one conductive region having an upper surface. A noble metal cap 62 is located directly on the upper surface of the at least one conductive region (i.e., conductive material 60). Because of the presence of the low k dielectric material and the low temperature chemical deposition process used in forming the noble metal cap, the noble metal cap 62 does not substantially extend onto an upper surface of the dielectric material 52 that is adjacent to the at least one conductive region (i.e., conductive material 60). Also, the noble metal cap 62 does not deposit on the dielectric material 52 surface and no residues of the noble metal form of the surface of the dielectric material 52. In this particular embodiment of the present invention, the upper surface of the dielectric material 52 represented by reference numeral 52A is coplanar with that of the upper surface (represented by reference numeral 60A) of each of the conductive materials 60.

Figure 4A:
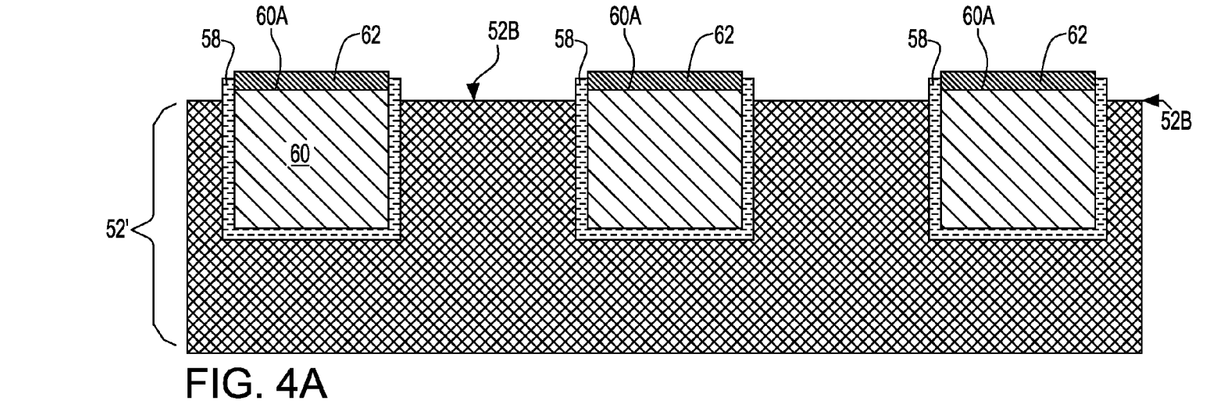
FIG. 4A-4B illustrates another interconnect structure through other processing steps of the present invention which may be performed on the structure shown in FIG. 3D.
Figure 4B:
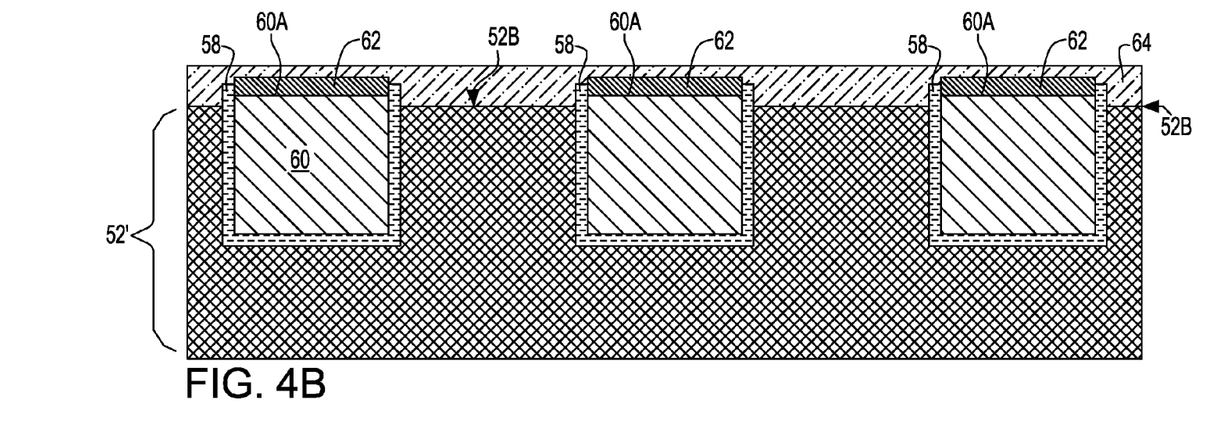

Reference is now made to FIGS. 4A-4B which are pictorial representations (through cross sectional views) illustrating the formation of an interconnect structure in accordance with another embodiment of the present invention. In this embodiment, the upper surface of the dielectric material is recessed as compared to the upper surface of each of the conductive materials embedded within the low k dielectric material.

This embodiment of the present invention begins by first providing the structure shown in FIG. 3D. After providing the structure shown in FIG. 3D, the structure is subjected to a selective etching process that is capable of recessing the dielectric material 52 to level that is beneath the upper surface of the conductive material 60. The recessing step used in forming the structure shown in FIG. 4A includes any wet chemical etching process that selectively removes dielectric material as compared to the materials of the diffusion barrier, the conductive material and the noble metal cap. Typically, the wet chemical etching process used in recessing the dielectric material 52 includes an acid etchant such as, for example, dilute HF, HCl, $H_2SO_4$ and $HNO_3$. It is noted that in FIG. 4A, reference numeral 52' denotes the recessed dielectric material and reference numeral 52B denotes the recessed upper surface of the recessed dielectric material 52'.

FIG. 4B shows the structure after forming a dielectric capping layer 64 on all exposed surfaces of the structure shown in FIG. 4A. The dielectric capping layer 64 includes one of the materials described above in the first embodiment and any of the above techniques used in forming the dielectric capping layer 64 in the first embodiment can be used in forming the dielectric capping layer in the second embodiment of the invention.

FIG. 4B illustrates an interconnect structure in accordance with another embodiment of the present invention. Specifically, the inventive interconnect structure includes a dielectric material 52' having a dielectric constant of about 3.0 or less, said dielectric material 52' having at least one conductive region (represented by conductive material 60) embedded therein. A noble metal cap 62 is located directly on an upper surface of the at least one conductive region (i.e., conductive material 60). Because of the presence of the low k dielectric material and since a low temperature chemical deposition is used in forming the noble metal cap, the noble metal cap 62 does not substantially extend onto an upper surface of the dielectric material 52' that is adjacent to the at least one conductive region (i.e., conductive material 60). Also, the noble metal cap 62 does not deposit on the dielectric material 52' surface and no noble metal residue also forms on the upper surface of the dielectric material 52'. In this particular embodiment of the present invention, the upper surface of the dielectric material 52' represented by reference numeral 52B is recessed relative to the upper surface (represented by reference numeral 60A) of each of the conductive materials 60.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an interconnect structure comprising:
    forming a pad stack comprising an oxide, nitride, oxynitride or any combination thereof on an exposed upper surface of a dielectric material having a dielectric constant of about 3.0 or less;
    forming at least one opening through said pad stack and into at least a portion of said dielectric material;
    forming a diffusion barrier within said at least one opening and on an exposed horizontal surface of remaining portions of the pad stack;
    forming a conductive material on said diffusion barrier;
    removing a first portion of the diffusion barrier, a first portion of the conductive material and said remaining portions of the pad stack present on said dielectric material and outside said at least one opening by planarization, while maintaining a second portion of said diffusion barrier and a second portion of said conductive material in said at least one opening of said dielectric material, wherein after said planarization, said upper surface of said dielectric material is coplanar with an upper surface of said second portion of said conductive material;
    forming a noble metal cap directly on said upper surface of said second portion of said conductive material, said noble metal cap does not substantially extend onto an upper surface of said dielectric material that is adjacent to said second portion of said conductive material, said noble metal cap forming does not result in noble metal residues on the upper surface of said dielectric material, and said forming includes a chemical deposition process that is performed at a temperature of about 300° C. or less.

2. The method of claim 1 wherein said chemical deposition process includes chemical vapor deposition process or atomic layer deposition.

3. The method of claim 1 wherein said temperature is less than about 200° C.

4. The method of claim 1 further comprising forming a dielectric capping layer located atop said dielectric material and said noble metal cap.

5. The method of claim 1 wherein said forming a noble metal cap includes selecting one of Ru, Ir, Rh, Pt and alloys thereof.

6. The method of claim 1 wherein a surface of said second portion of said dielectric barrier is in direct contact with a portion of said dielectric material.

7. The method of claim 6 wherein said noble metal cap does not extend onto a topmost surface of said second portion of said diffusion barrier.

8. The method of claim 1 wherein said noble metal cap extends onto 5 Å of less of said upper surface of said dielectric material.

9. The method of claim 1 wherein said forming the noble metal cap is performed utilizing a deposition rate from about 0.2 to about 0.8 Å/sec.

10. A method of forming an interconnect structure comprising:
    providing a dielectric material having a dielectric constant of about 3.0 or less, said dielectric material having at least one conductive material embedded within said dielectric material, said at least one conductive material having an upper surface that is bare;
    forming a noble metal cap directly on said upper surface of said at least one conductive material, said noble metal cap does not substantially extend onto an upper surface of said dielectric material that is adjacent to said at least one conductive material, said noble metal cap forming does not result in noble metal residues on the upper surface of said dielectric material, and said forming includes a chemical deposition process that is performed at a temperature of about 300° C. or less; and
    recessing said dielectric material after forming said noble metal cap.

11. The method of claim 10 further comprising a dielectric capping layer located atop said recessed dielectric material and said noble metal cap.

12. A method of forming an interconnect structure comprising:

providing a dielectric material having a dielectric constant of about 3.0 or less, said dielectric material having at least one conductive material embedded within said dielectric material, said at least one conductive material having an upper surface that is bare;

forming a noble metal cap directly on said upper surface of said at least one conductive material, said noble metal cap does not substantially extend onto an upper surface of said dielectric material that is adjacent to said at least one conductive material, said noble metal cap forming does not result in noble metal residues on the upper surface of said dielectric material, and said forming includes a chemical deposition process that is performed at a temperature of about 300° C. or less; and etching exposed portions of the upper surface of the dielectric material to provide a recessed dielectric material surface relative to the upper surface of the noble metal cap.

13. The method of claim 12 wherein said chemical deposition process includes chemical vapor deposition process or atomic layer deposition.

14. The method of claim 12 wherein said temperature is less than about 200° C.

15. The method of claim 12 further comprising forming a dielectric capping layer located atop said recessed dielectric material surface and said noble metal cap.

16. The method of claim 12 wherein said etching said exposed portions of said upper surface of the dielectric material comprises an acid etchant selected from the group consisting of dilute HF, HCl, $H_2SO_4$ and $HNO_3$.

17. The method of claim 12 further comprising forming a diffusion barrier liner between said dielectric material and said at least one conductive material, wherein a surface of said dielectric barrier liner is in direct contact with a portion of said dielectric material, and wherein an upper surface of the diffusion barrier liner is position below the upper surface of the noble metal cap and above the recessed dielectric material surface.

* * * * *